United States Patent
Wong et al.

[11] Patent Number: 5,242,897
[45] Date of Patent: Sep. 7, 1993

[54] HIGH $T_c$ SUPERCONDUCTING OXIDES

[75] Inventors: Kai W. Wong; Xin Fei, both of Lawrence, Kans.

[73] Assignee: The University of Kansas, Lawrence, Kans.

[21] Appl. No.: 783,356

[22] Filed: Oct. 28, 1991

Related U.S. Application Data

[63] Continuation-in-part of Ser. No. 612,201, Nov. 13, 1990, abandoned.

[51] Int. Cl.$^5$ .................. H01B 12/06; H01L 39/12; C01G 3/00; C04B 41/89
[52] U.S. Cl. ............................ 505/1; 505/780; 505/782; 505/783; 505/779; 252/520; 252/521; 501/152; 501/123; 501/126; 501/151
[58] Field of Search .................. 505/1, 777, 778, 729, 505/780, 782, 783; 252/520, 521; 501/152, 123, 126, 151

Primary Examiner—Karl Group
Assistant Examiner—C. M. Bonnar
Attorney, Agent, or Firm—Hovey, Williams, Timmons & Collins

[57] ABSTRACT

Complex superconducting oxides are fabricated through appropriate selection and use of fundamental superconducting "building blocks." In this fashion, the invention provides a rationalized method of fabricating complex oxides having desirably high $T_c$ values. In another aspect of the invention, novel, 112 and 12 superconducting oxides are described.

4 Claims, 9 Drawing Sheets $Ca_{0.8}Bi_{0.2}SrCu_2O_5$

HIGH $T_c$ SUPERCONDUCTING OXIDES

This application is a continuation-in-part of identically titled application Ser. No. 07/612,201, filed Nov. 13, 1990.

BACKGROUND OF THE INVENTION

1. Field of the Invention

The present invention is broadly concerned with a method of fabricating complex superconducting oxides through appropriate selection and mixing together of a new fundamental substructure or "building block", which is intrinsically superconducting, together with stoichiometric proportions of the oxides making up another intrinsically superconducting fundamental structure, whereby a virtual infinity of complex oxides can be formed. Thus, the invention comprehends a completely rationalized method of fabricating complex oxides of desirable $T_c$ values using the fundamental substructures. In another aspect of the invention, stable, superconducting 112 and 12 ceramic oxides are described.

2. Description of the Prior Art

Superconductivity refers to that special state of a material where its resistance to electrical current flow suddenly and completely disappears when its temperature is lowered. Below this onset or critical temperature $T_c$, a characteristic of the material, the electrical resistance does not merely drop to a low level but it vanishes entirely. Only a very limited list of materials exhibit such a state. The discovery of the first superconductor occurred in 1911. Heike Kammerlingh Onnes discovered that Mercury lost all detectable resistance at a temperature just 4° above absolute zero.

A superconductor also exhibits perfect diamagnetism below its critical temperature, i.e., it expels all magnetic field lines from its interior by producing an opposing magnetic field from a current flowing on its surface. As a consequence of the perfect diamagnetism of superconductors, they can be used to produce magnetic levitation as envisioned in high speed transport systems of the future, where magnetic repulsion is used to counter gravity. The perfect diamagnetism property of superconductors is called the Meissner effect after its discoverer.

Superconductivity is the only large scale quantum phenomenon involving charges found in solid materials. The current-carrying electrons in the superconductor behave as if they were part of a monumentally large single molecule the size of the entire specimen of the material. The macroscopic quantum nature of superconductors makes them useful in measuring magnetic field quantities to high precision or facilitates the measurement of such quantities so small as to be heretofore unmeasurable.

Hence, all three aspects of superconductors give promise of exciting new technologies or improvements in old technologies. However despite the tremendous potential of superconductors, formidable technical problems must be overcome if such materials are to achieve practical commercial application. For example, until very recently, all known superconducting materials attained their superconducting state only at very low (cryogenic) temperatures on the order of 4°-20° K. Such low temperatures had to be reached by evaporating liquid helium, the only substance that remains liquid down to temperatures approaching absolute zero. The few sources of helium in nature and its expensive processing make it a very costly cryogenic fluid.

In recent years, a plethora of new superconducting oxides have been announced by researchers around the world. While these new materials have relatively high critical temperatures on the order of 80°-130° K., they are plagued by a number of intractable problems. For example, certain of these prior materials, while they have high $T_c$ values, have very low (e.g., 1 ampere/cm$^2$ current density values, particularly when the materials are bulk sintered and therefore have random crystal orientation therein. Such prior materials may exhibit higher current densities, but only when formed as oriented epitaxal films on substrates. Obviously, such materials, while they exhibit superconducting properties, are totally impractical for use in most commercial applications. Finally, many of these prior superconductors are extremely brittle and frangible, which again effectively precludes their use as commercial-scale electrical conductors for example.

Accordingly, while there is recent intense interest in superconducting materials, presently available oxides of this character have one or more serious deficiencies which render them useless in commercial applications.

A persistent problem in the art of superconductivity is the lack of a fundamental understanding of the underlying rationale of the oxides and how they can be fabricated. Therefore, researchers have been forced to pursue an essentially ad hoc program of development without an overarching theory to guide them. The situation is very analogous to the early study of genetics before DNA had been properly characterized, where researchers were literally "groping in the dark." After DNA was characterized, however, geneticists were able to more rationally study genetics and this led to a tremendous increase in activity in that science. Similarly, there is a need in the superconductor art for a fundamental breakthrough which would provide an overall explanation for superconductivity and a more rational approach to the development and fabrication of complex superconducting oxides.

SUMMARY OF THE INVENTION

The present invention represents a significant departure from the prior art by providing the necessary theoretical understanding of superconductivity and a correspondingly rationalized technique for the fabrication of complex superconducting oxides.

In particular, it has been found that all known ceramic superconductors can be considered as the stacking, in various orders and orientations, of three fundamental substructures or "building blocks." Furthermore, it has been discovered that the $T_c$ exhibited by a given superconducting oxide can be very accurately determined as the simple summation of the $T_c$ values of the individual substructures. As a consequence of these facts, the fabrication of complex superconducting oxides can be more readily achieved.

Broadly speaking, the invention includes a method of fabricating superconducting ceramic oxides which comprises the steps of first providing a quantity of a fundamental oxide which is intrinsically superconducting, and preferably with the highest practical T value, whereupon this oxide is mixed with stoichiometric proportions of the non-superconducting oxides making up another of the fundamental superconducting substructures. In this manner, if it is desired to produce a superconducting oxide having a $T_c$ of, e.g., 130° K., one may start with a fundamental superconducting oxide having a $T_c$ of 80° K., followed by appropriate reaction with the oxides making up another fundamental substructure whose total $T_c$ value is in excess of 50° K.

In more detail, the specific invention hereof involves provision of a fundamental superconducting oxide of the following formula is provided:

$$(R_{1-x}Q_x)M_2(O_{1-z}F_z)_{4-d} \quad \text{I}$$

where

M is a multivalence metal;

R is a metal selected from the group consisting of the rare earth metals and metals having a 3+ valency;

Q is a dopent different from R and selected from the group consisting of the rare earth metals, Ca, Sr, Ba, Tl, Bi, Pb, Sb, Te, W and V;

x is above zero and less than 1, and preferably less than about 0.3;

d is an oxygen deficiency factor for insuring a substantial ionic valency balance which is less than zero but sufficient to establish the stability of the oxide; and z is greater than zero but less than 1, and preferably less than about 0.6.

This quantity of superconducting oxide is then mixed with stoichiometric quantities of non-superconducting oxides required for the fabrication of a fundamental superconducting oxide different from the foregoing and having one of the formulae $$(R_{1-1}Q_x)(A_{1-x}Q^*_x)MO_{4-d} \text{ or } \quad \text{II}$$

$$(A_{1-x}Q^*_x)MO_{3-d} \quad \text{III}$$

where

M, R, Q, x and d are as previously defined;

A is a metal selected from the group consisting of Ca, Sr, Ba, Na, and K; and

Q* is a dopent different from A and selected from the group consisting of the rare earth metals, Ca, Sr, Ba, Tl, Bi, Pb, Sb, Te, W and V.

The fundamental superconductors represented by formulae II and III are themselves known. The mixture of oxide I and the non-superconducting oxides used to fabricate the oxides represented by formulae II and III is used to fabricate a complex superconductor, typically by grinding and sintering.

The aforementioned starting 112 superconductor of formula I is itself novel, i.e., the invention further includes a new class of 12 oxides represented by formula I.

Finally, the invention also comprehends new stable 112 superconductors having the formula $$(R_{1-x}Q^{**}_x)_iA_jCu_2O_{5-d} \quad \text{IV}$$

where:

R is a metal selected from the group consisting of the rare earth metals, Ca, Sr, Ba, Ag, Tl, K or Na, x is above zero and less than 1 (and preferably from about 0.05 to 0.3), and Q** is a dopent different from R and selected from the group consisting of Ca, Sr, Ba, Tl, Bi, Pb, Sb, Te, W and V, and said dopent is present at a level such that the sum of the valences of R and Q at least 3;

A is a metal selected from the group consisting of Ca, Sr, Ba, Na and K, and the sum of the valences of A and Cu is less than 6, and d is an oxygen deficiency factor for ensuring a substantial ionic valency balance which is less than zero but sufficient to establish the stability of the oxide; and i and j are both equal to 1.

Exemplary 112 oxides in accordance with the invention include $Ca_{1-x}Bi_xSrCu_2O_{5-d}$, and $K_{1-x}Ca_x$-$BaBi_2O_{5-d}$, whereas the new 12 oxides are exemplified by the representative superconductor $Y_{0.8}Ba_{0.2}Cu_2(O_{1-z}F_z)_{4-d}$.

DESCRIPTION OF THE PREFERRED EMBODIMENTS

Figure 1:
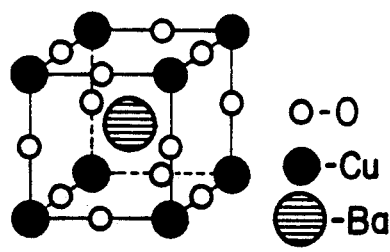
FIG. 1 is a schematic representation of the crystalline structure of the three fundamental superconducting "building blocks" useful in the fabrication of complex superconductors (structures (a)–(c)), and the shifted, stacked crystalline structure of two (c) cubic structures (structure (d)), with representative atoms for each structure being illustrated.
Figure 1:
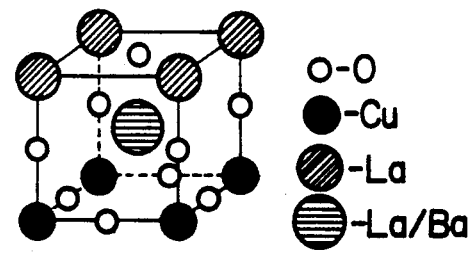
Figure 1:
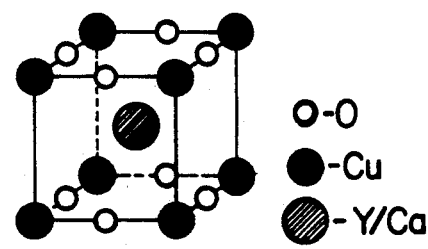
Figure 1:
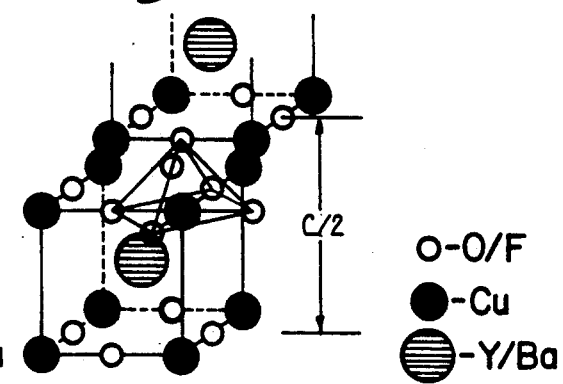

Since the first discovery of ceramic oxide superconductors, two basic metallic families have been reported. They are the bismuth family, which includes the earliest compound Bi-Pb-Ba-O and the cubic compound Bi-Ba-K-O K-O and the much investigated Cuprate oxide family. So far only in the Cuprate family have $T_c$ values above liquid nitrogen temperature been observed. This amazing feature makes the Cuprate oxide family rather special. Within two years of the discovery in 1986 of the first Cuprate superconductor $La_{2-x}Ba_xCuO_4$ which has a $T_c40$ K, $T_c$ values as high as 125 K in the $Tl_2Ca_2Ba_2Cu_3O_{10}$ have been reported. Although there were many reports of even higher $T_c$ values during the intervening period, none seemed to be stable and easily reproducible. It has now been discovered that high $T_c$ Cuprate superconductors can be viewed as the stacking of substructures which themselves are also superconducting and whose electronic band structures can be first simulated. The existence of the superconductor depends on the existence of an intrinsic valence hole band separated by a relatively narrow band-gap to an empty conduction band. The stability of the entire complex high $T_c$ structure depends on the stability of each substructure or "building block." From this viewpoint, the existence of at least three cubic substructures can be postulated, as shown in FIG. 1. The structure 1(a) has been realized in the non-copper cubic $BiBa_{1-x}K_xO_{3-d}$ and, the cubic Cuprate $Ba_{1-x}Tl_xCuO_{3-d}$. However, the exact Cuprate oxide structure has yet to be confirmed. The structure 1(b) is not symmetric and must exist by shifted stacking. The simplest is represented by the $La_{2-x}Ba_xCuO_4$. The structure 1(c), a substructure in many Cuprate superconductors, has never heretofore been fabricated per se. Similar to the structure 1(b), 1(c) also forms the shifted stacking of two cubics as shown in FIG. 1(d). Thus, this 1(d) structure has two $CuO_2$ planes.

The method for fabricating the structure 1(d) is very different from those reported for the fabrication of the now well known Cuprate oxide superconductors. As can be seen from the general stoichiometric formula $Y_{1-x}Ba_xCu_2(O_{1-z}F_z)_{4-d}$ defined previously, the basic structure must be provided by $YCu_2O_{4-d}$ and not by $BaCu_2O_3$. Thus a two-step process is usually best for the fabrication as described below.

Figure 18:
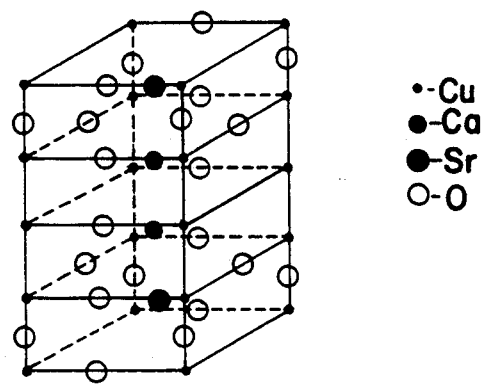
FIG. 18 is a schematic representation depicting the crystalline structure of the oxide $Ca_{0.8}Bi_{0.2}SrCu_2O_5$, which is a combination of the substructures (a) and (c) depicted in FIG. 1.

112 Superconducting Oxides—FIG. 18 Structure

The following example describes the fabrication and testing of a representative 112 copper-containing superconducting oxide. It is to be understood that the examples is illustrative only, and nothing therein should be taken as a limitation as an overall scope of the invention.

EXAMPLE 1

For $Ca_{0.8}Bi_{0.2}SrCu_2O_5$, AR grade powders of $CaCO_3$, $Bi_2O_3$ and CuO are mixed in a predetermined molar ratio of Ca:Bi:Sr:Cu=0.8:0.2:1:2 and manually ground in an agate mortar to an average particle size of $10^{-4}$ mm. The mixture was then pressed into pellets (7 mm diameter, and 1 mm thick) using a pressure of 7 K kg/cm² with a hydraulic press. These pellets were then placed into an aluminum oxide boat and inserted into the Lindberg Model 847 quartz tube furnace, which had already been set at 930° C. The sintering time lasted for 48 hours. The pellets were allowed to cool at a rate of 1° C./minute inside the furnace until room temperature. We call the above sintering process as heat treatment alpha. Note that there is no preheating process. However, such samples would be largely oxygen deficient. The same samples were reground and repressed into pellets and annealed at 930° C. in flowing oxygen for an additional 48 hours (this is heat treatment beta).

Figure 2:
FIG. 2 is the resistivity curve for the fundamental superconducting oxide $Ca_{0.8}Bi_{0.2}SrCu_2O_5$, after the alpha-stage heat treatment.
Figure 2:
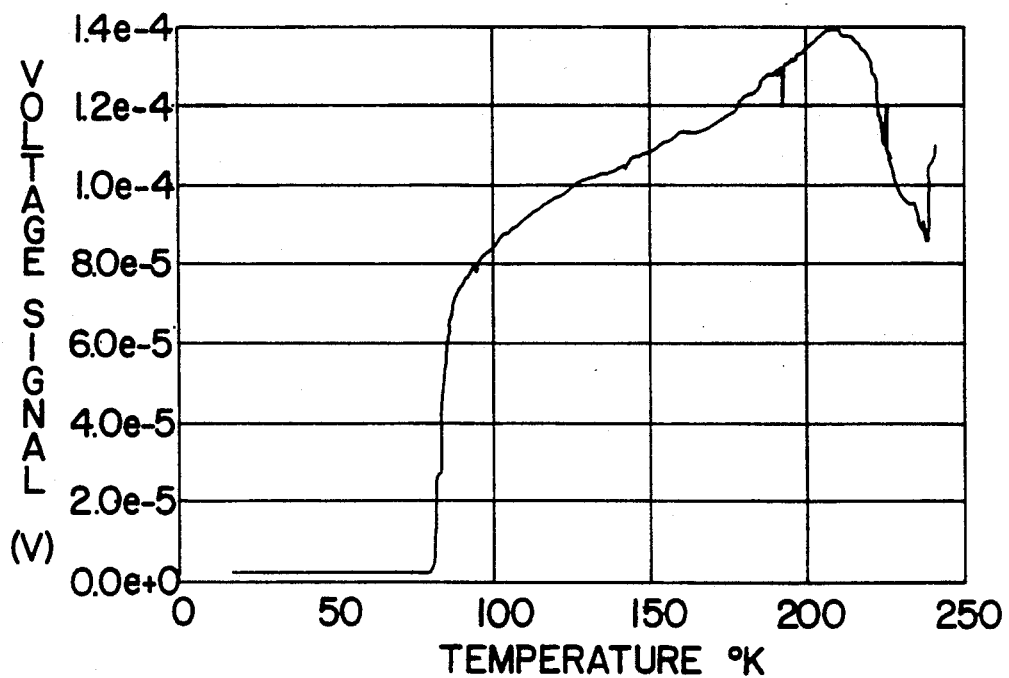
Figure 3:
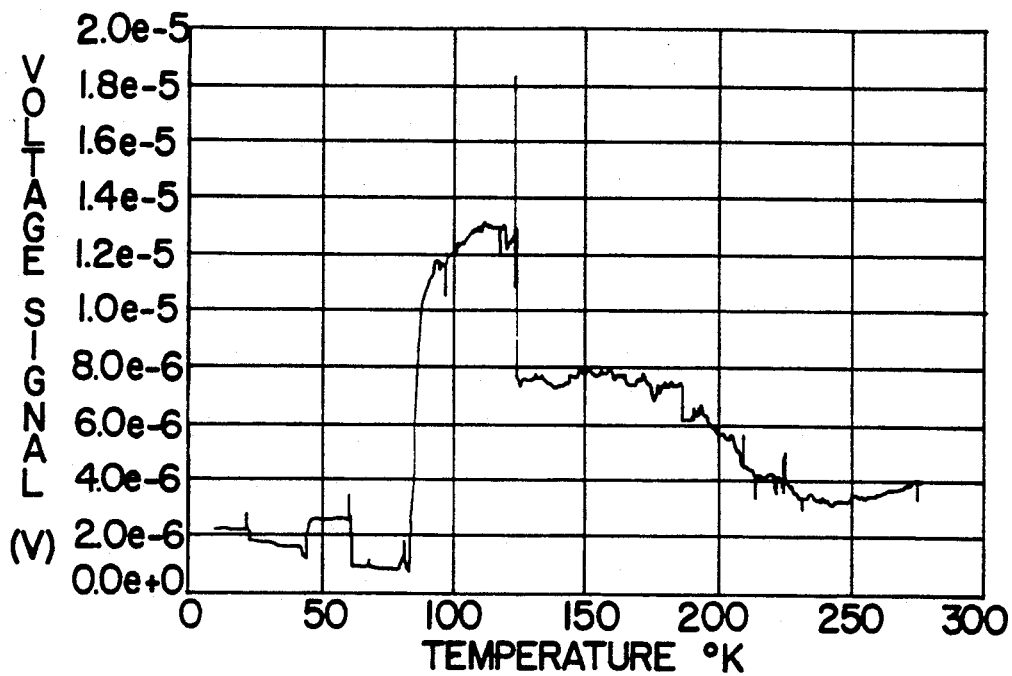
FIG. 3 is another resistivity curve for the oxide of FIG. 2, but after the sample was placed within a helium gas refrigerator for 24 hours.

The R-T relation of one sample, which has only received heat treatment alpha, is indicated in FIG. 2, corresponding to measurement starting at 240° K. The vertical scale is the voltage of the standard 4-probe technique, and is a measure of the resistance in arbitrary units. An AC of 1 mA at 27 Hz was used as the current source. The sample was then left inside the He gas of a commercial APD refrigerator for over 24 hours. The resistivity was then found to drop by one order of magnitude (FIG. 3). Next, the temperature of the refrigerator was increased and the R-T relation has the shape of the curve C shown in FIG. 4. The sample holder was tapped occasionally to avoid anomalies due to poor contacts. No fluctuations in the voltage output were recorded.

Figure 5:
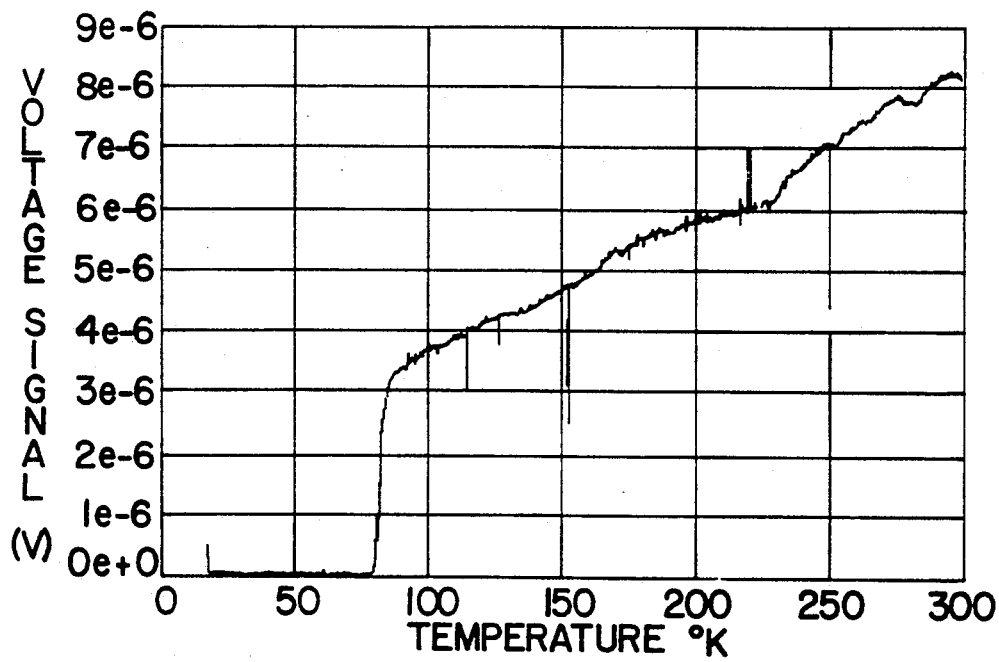
FIG. 5 is the resistivity curve of the FIG. 4 sample after the sample was placed in air for more than one day and the temperature decreased from about room temperature.
Figure 6:
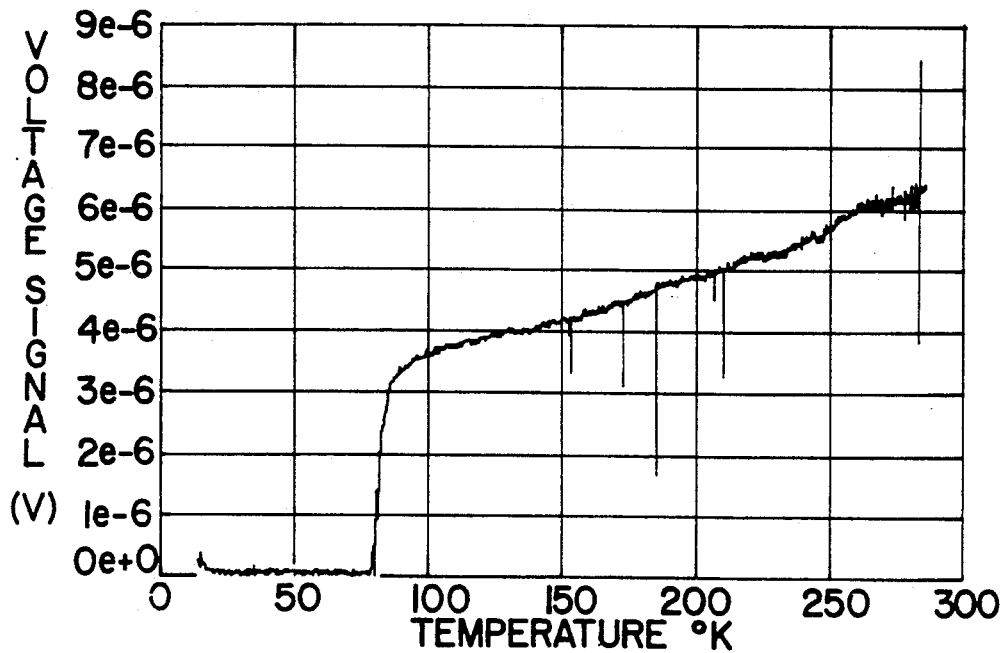
FIG. 6 is the resistivity curve of the FIG. 5 sample upon elevation of temperature from about 15° K.

The same sample with the original contacts attached was then placed in air for more than 1 day. It was next put back into the refrigerator and R-T measurement was again carried out, starting from about 300° K. (FIG. 5). The temperature was then raised and the R-T curve for this upward trend is shown in FIG. 6.

Figure 7:
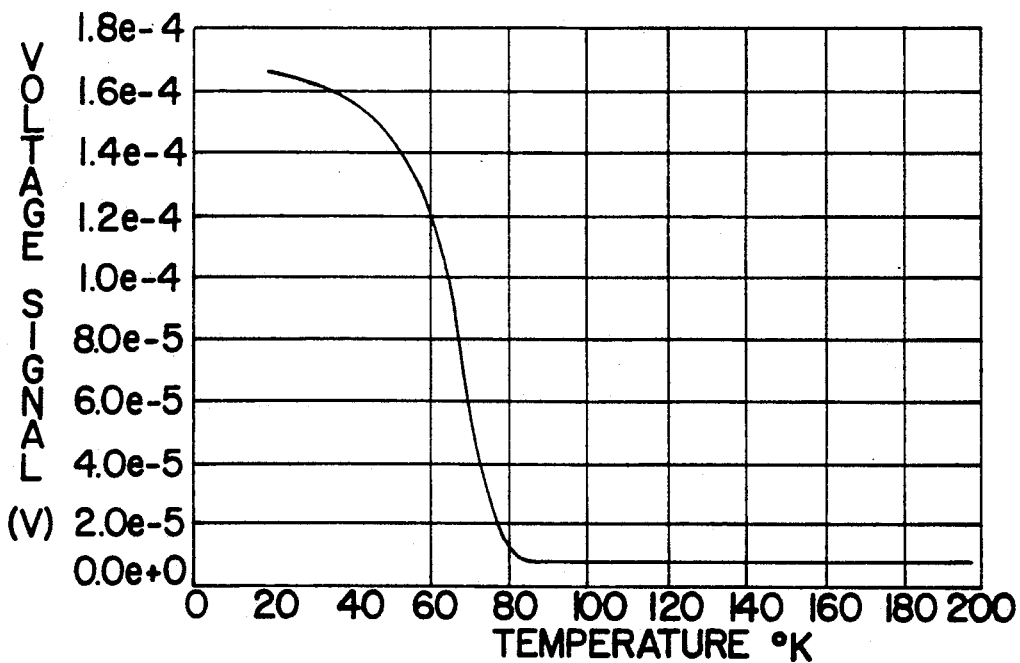
FIG. 7 is a graph of a Meissner effect determination made using 0.22 grams of the FIG. 2 superconducting oxide.

The diamagnetic energy measurements (i.e., Meissner effect) were performed on 0.22 gm of the sample after alpha heating refrigeration cycling shown in FIGS. 2 and 3. Basically the same result was obtained and FIG. 7 demonstrates this Meissner effect. The R-T curve for a sample receiving both heat treatments alpha and beta is characteristic of the common metallic-like superconductor, dropping sharply with $T_c$ (R=0) is about equal to 80°-82° K., without the irregularities as those in FIGS. 5 and 6. The condition under which R-T irregularities occur is difficult to control. However, any dip of R before $T_c$ is not accompanied by a diamagnetic transition. Since in this 112 compound these irregular dips in R occur above $T_c$, its effect on superconductivity cannot be determined. When Bi totally replaced Ca in the predetermined composition, i.e., $BiSrCu_2O_5$, no irregularities in R-T curves were found, and the sample is not superconducting.

Figure 4:
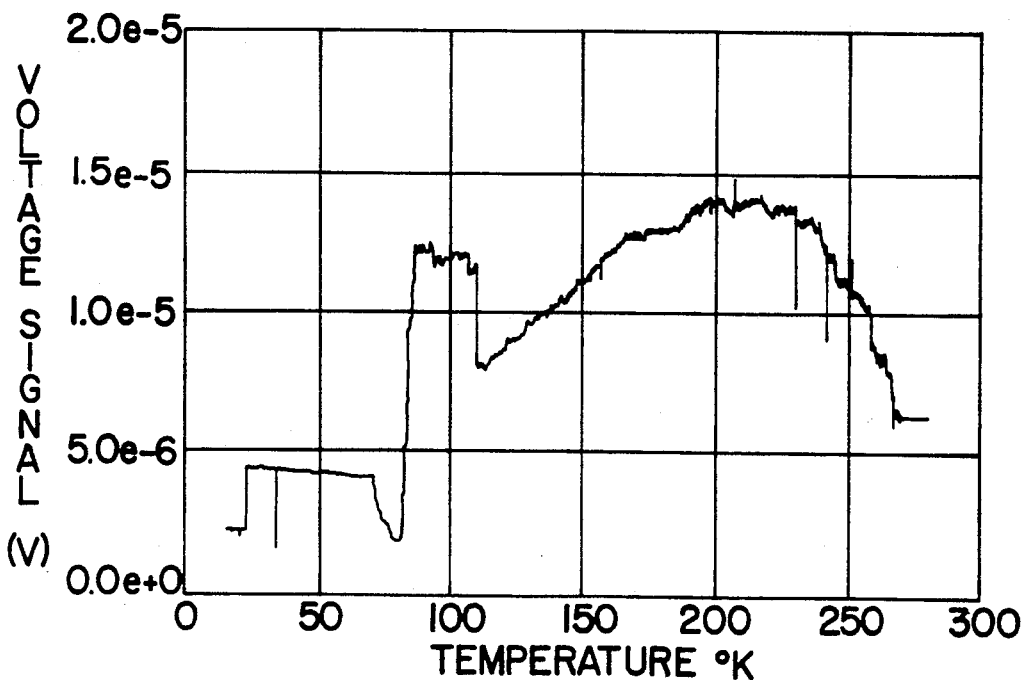
FIG. 4 is another resistivity curve for the oxide of FIG. 2, after the FIG. 3 data was obtained, and upon reheating of the sample from 15° K. to room temperature.

The following salient features were noted in light of the foregoing experiments on $Ca_{0.8}Bi_{0.2}SrCu_2O_{5-d}$: (i) as indicated in FIG. 2, after the sample was fabricated, there was a steep initial rise in resistivity at 240° K. before turning down at 205° K. At lower temperature, the R-T curve is typical that of a metallic-like superconductor; (ii) after being kept inside helium gas for over 1 day, the resistivity rise at T is greater than 200° K. and was more gradual (FIG. 3). However, the resistance of the sample has decreased by one order of magnitude. There was a sudden jump of resistivity around 123° K., before dropping at 80° K. at which the sample became superconducting; (iii) during the upward thermal cycle immediately following, a similar sudden change (in this case dropping) of resistivity occurred at 115° K. (FIG. 4). The R-T curve then showed a broad peak and turned down rather sharply and stabilized at very low resistivity at 275° K, the end of the measurement. These irregularities appear to be genuine and are missing in the common superconductors. (The voltage signals below the dotted lines shown in FIGS. 3 and 4, can be attributed to noise in the equipment); (iv) there were sudden changes in R at T of about 120° K. not accompanied by magnetic susceptibility change under the conditions specified in FIGS. 3 and 4; (v) the very low resistance level achieved at high temperature (of about 270° K.) is a very important aspect in the following senses. Since such a sudden drop is not associated with Meissner effect, the sample is not a superconductor at such a temperature in the helium gas environment. This is believed to be an anti-ferromagnetic transition. If this phase can be stabilized, an "ultra-low resistance" ceramic conductor could be made which should be useful practically; (vi) the structural change at T of about 120° K. and T of about 270° K. would give crucial information on conductivity and superconductivity; (vii) after leaving the sample for more than a day, the R-T curves for both ascending and descending temperature processes lead to that typical of a usual metallic-like superconductor, implying that the appearance of irregularities stated above is closely related to oxygen content of the sample; (viii) the FIG. 7 data indicates that the Ca-112 structure fabricated is very close to a single phase.

The structure of this oxide is schematically illustrated in FIG. 18, where it will be seen that the structure is in effect the stacked combination of fundamental substructures (a) and (c) illustrated in FIG. 1.

EXAMPLE 2

Figure 8:
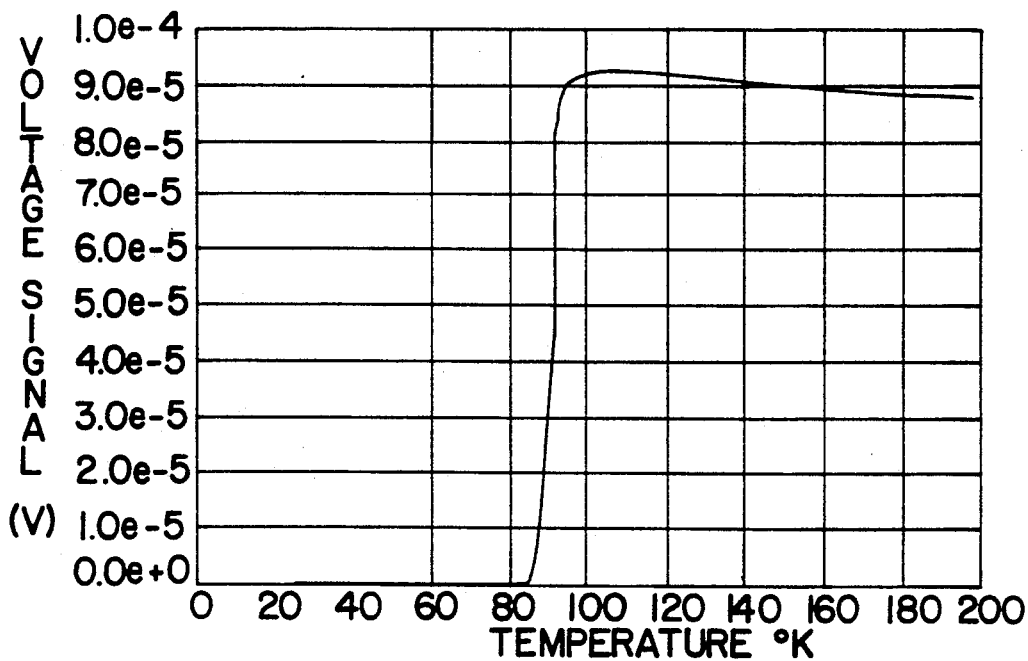
FIG. 8 is the resistivity curve developed using the 123 superconducting oxide $YBa_2Cu_3O_{7-d}$.
Figure 9:
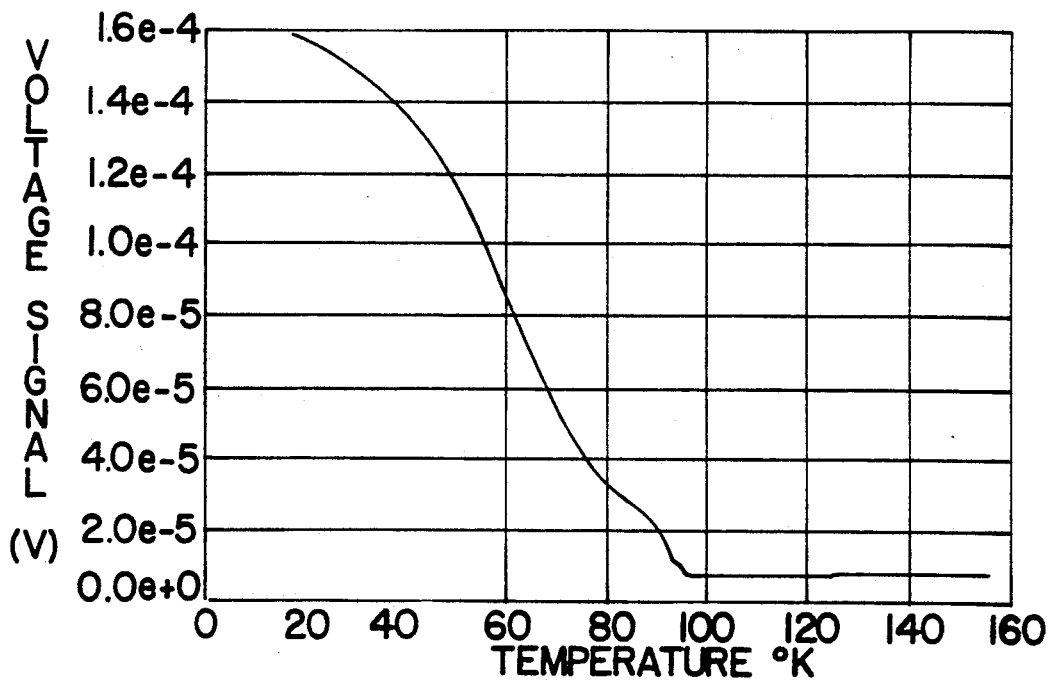
FIG. 9 is a graph of a Meissner effect determination made using 0.23 grams of the FIG. 8 oxide.

Japanese patent Document No. 130,420 purportedly describes a 112 superconducting oxide of the formula $YBaCu_2O_5$. It has been determined, however, that undoped 112 rare earth oxides do not exist. In the case in question, mixture, grinding and sintering of molar proportions of $Y_2O_3$, $CuO$ and $BaO$ will yield a crystalline structure actually made up of separate phases of a 123 superconducting oxide, $YBa_2Cu_3O_{7-d}$ and the non-superconducting oxide $Y_2BaCuO_x$, along with residual quantities of the starting oxide $CuO$. Indeed, in FIG. 1 of the publication, the authors depict the well-known 123 structure. The 123 superconducting oxide is known, and the resistivity and Meissner effect data respecting this oxide is set forth in FIGS. 8 and 9.

12 Superconducting Oxides—Structure 1(d)

The present invention comprehends a new family of 12 Cuprate oxide superconductors as defined in formula I above. The critical temperatures of this family are on the order of 90° K. They have an orthorhombic unit cell which consists of the half unit shifted stacking of a cubic structure upon another. The lattice parameters are on the order of a=3.805A, b=3.846A, and c=12.341A.

The following examples describe the fabrication of representative 12 oxides of this family.

EXAMPLE 3

In this example, the 12 superconducting oxide $Y_{1-x}Ba_xCu_2(O_{1-z}F_z)_{4-d}$ was fabricated using a two-step procedure. In the first step, the non-superconducting oxide $YCu_2O_{4-d}$ was fabricated, and in the second step this oxide was ground together with $BaF_2$ to form the final superconducting oxide defined above.

Figure 14:
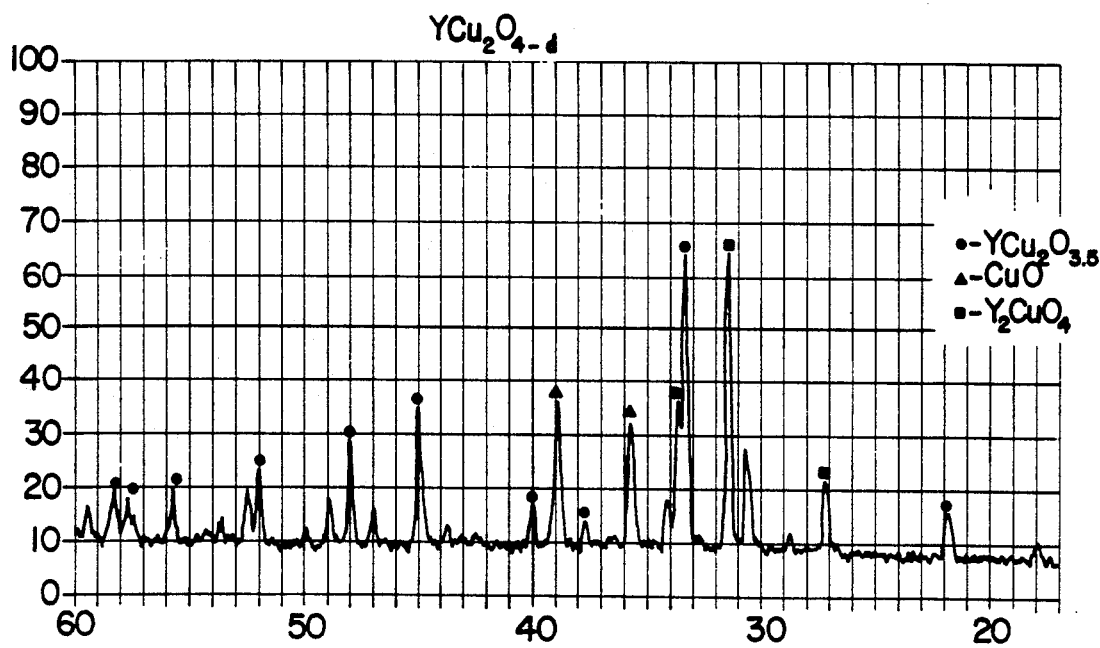
FIG. 14 is an X-ray crystallography graph developed using the oxide $YCu_2O_{4-d}$, showing the structure to be non-superconducting.

In particular, in the first step, molar ratios of $Y_2O_3$ and $CuO$ were employed to achieve the nominal structure $YCu_2O_{3.5}$. These starting oxides were ground together to achieve an average particle size of about $10^{-4}$ mm, and were pressed into pellets using a hydraulic press (8 tons pressure). The pellets were then placed in an aluminum oxide boat, and the boat placed inside a Lindberg tube furnace. The sample was heated to 950° C. in flowing oxygen for a duration of 24 hours. Thereafter the pellets were furnace-cooled in the continuous oxygen flow until they reached room temperature. A dark turquoise color, non-superconducting compound $YCu_2O_{4-d}$ was formed, having the basic structure given by FIG. 1(d). FIG. 14 gives the X-ray spectroscopy results derived from this compound, which elucidates the structure thereof.

In the second step, the $YCu_2O_{4-d}$ oxide was reground and mixed with a molar amount of $BaF_2$ ($SrF_2$ could be used as an alternative to $BaF_2$) to form the nominal composition $YBa_xCu_2O_4F_{2x}$, with x ranging from about 0.2 to 1.0. These materials were again ground to the same particle size described above, and pressed into pellets using the 8 ton press. The pellets were placed inside an aluminum oxide ceramic tube having one open end and one closed end. The open end of this tube was substantially but not completely blocked by the closed end of another identical ceramic tube, and both tubes were placed inside a Lindberg 54233 tube furnace. The ends of the tube furnace were then sealed by stoppers, and a gas outlet line was provided passing through one of the stoppers. the free end of the gas outlet line was submerged in water to prevent the ingress of air into the tube furnace, while permitting escape of gases from the tube furnace. In the second heating stage, the temperature was raised to 250° C. and maintained for 48 hours. It was found that preventing entrance of atmospheric oxygen was very critical during this stage of processing, so as to permit fluorine doping of the first stage oxide. The pellets were then allowed to slowly furnace-cool until they reached room temperature.

Figure 15:
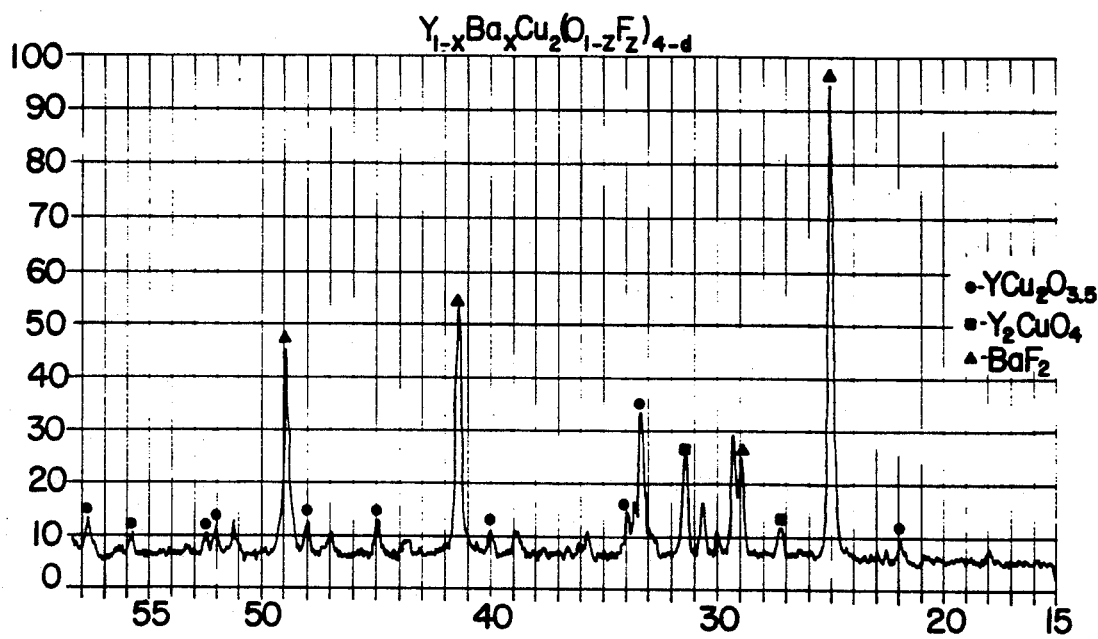
FIG. 15 is an X-ray crystallography graph developed using the doped oxide $Y_{1-x}Ba_xCu_2(O_{1-z}F_z)_{4-d}$, showing the same to be superconducting.
Figure 16:
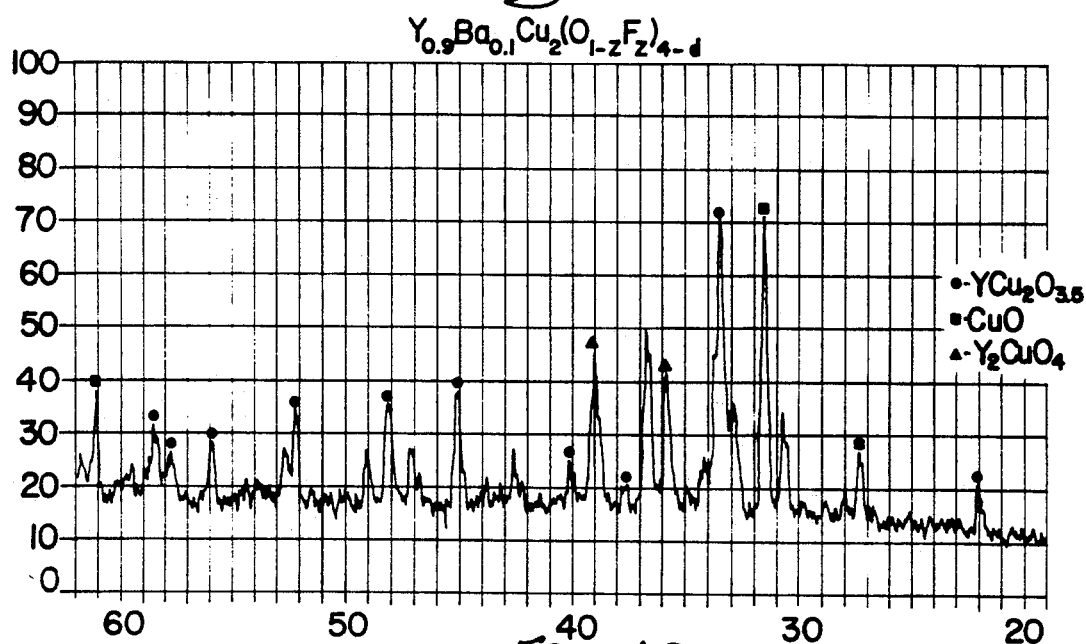
FIG. 16 is an X-ray crystallography graph similar to that of FIG. 14, but depicting the results derived from the use of oxide $Y_{0.9}Ba_{0.1}Cu_2(O_{1-z}F_z)_{4-d}$.

Any amount of $BaF_2$ yielding an x value greater than 0.2 will result in a superconductor having a $T_c$ on the order of 90° K. Powder X-ray analysis (see FIGS. 15 and 16) indicate that the superconducting phase results from the presence of a crystalline structure in accordance with FIG. 1(d). Excessive $BaF_2$ will remain in the oxide whenever the x value is greater than 0.3, as specifically shown in FIG. 15. Note that in FIG. 16, where x is about 0.1, no $BaF_2$ was detected.

Figure 12:
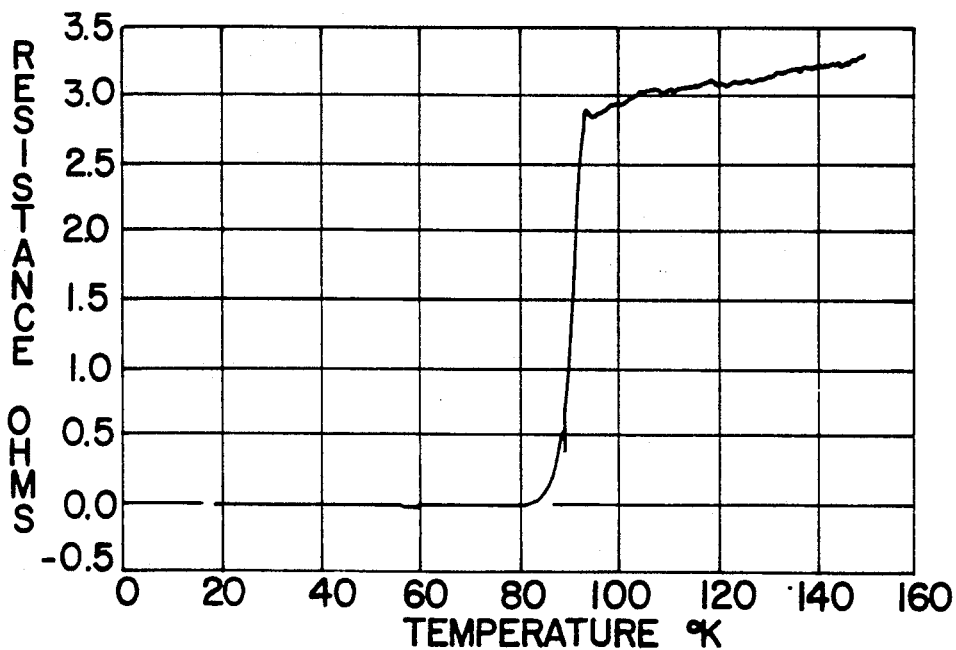
FIG. 12 is the resistivity curve developed using the oxide $Y_{0.7}Ba_{0.3}Cu_2(O_{1-z}F_z)_{4-d}$.
Figure 13:
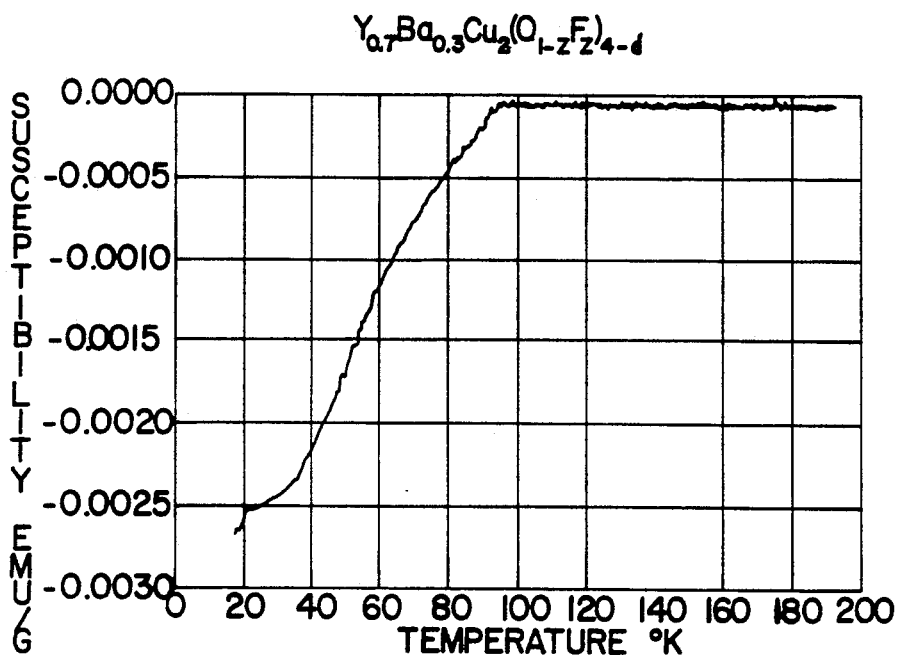
FIG. 13 is a graph of a Meissner effect determination made using the oxide of FIG. 12.

FIGS. 12 and 13 are respectively the resistivity and Meissner effect graphs of the most optimum oxide prepared in accordance with this method, namely $Y_{0.7}Ba_{0.3}Cu_2(O_{1-z}F_z)_{4-d}$.

Figure 11:
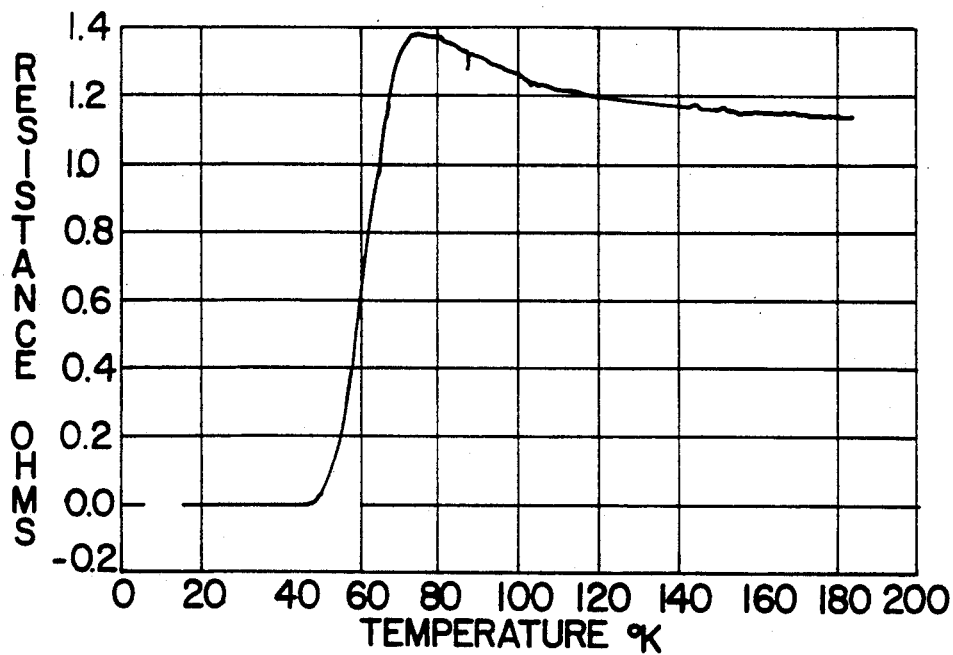
FIG. 11 is the resistivity curve developed using the oxide $Y_{0.8}Ba_{0.2}Cu_2(O_{1-z}F_z)_{4-d}$.

FIG. 11 is a resistivity effect graph respecting the oxide $Y_{0.8}B_{0.2}Cu_2(O_{1-z}F_z)_{4-d}$. A comparison of FIGS. 11 and 12 will demonstrate that the FIG. 11 oxide has a lower $T_c$ and a transition which is not as sharp as that found in FIG. 12. This results from the fact that in the FIG. 11 compound, there is insufficient fluorine present in the structure, as compared with FIG. 12. The greater amount of $BaF_2$ used in the fabrication of the FIG. 12 compound thus greatly influences the $T_c$ value and transition characteristics.

Figure 10:
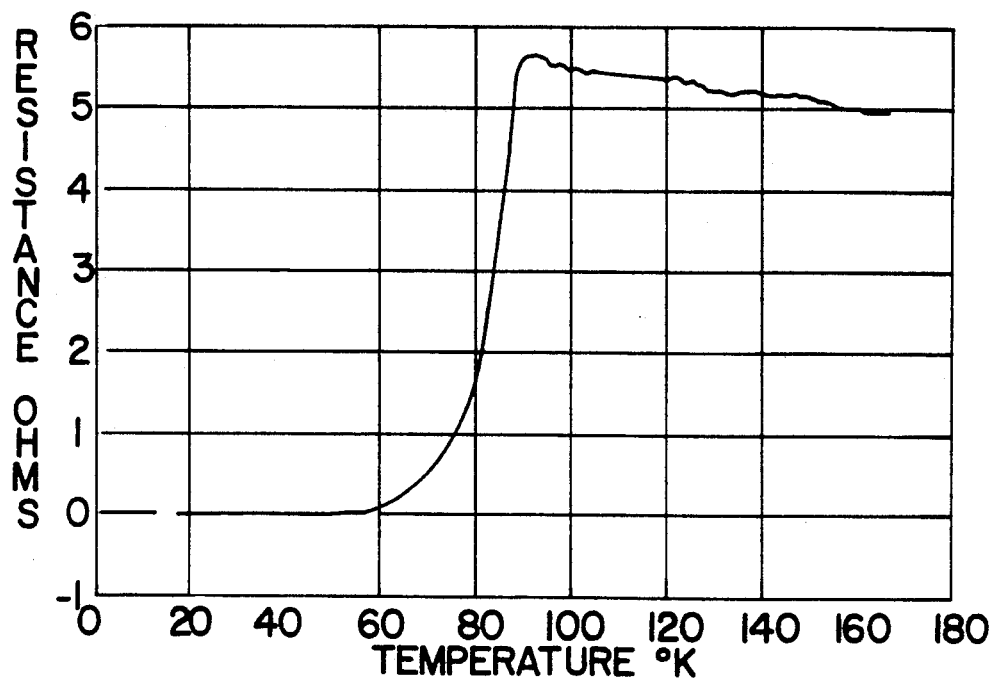
FIG. 10 is the resistivity curve developed using the oxide $Pr_{0.8}Ba_{0.2}Cu_2(O_{1-z}F_z)_{4-d}$.
Figure 17:
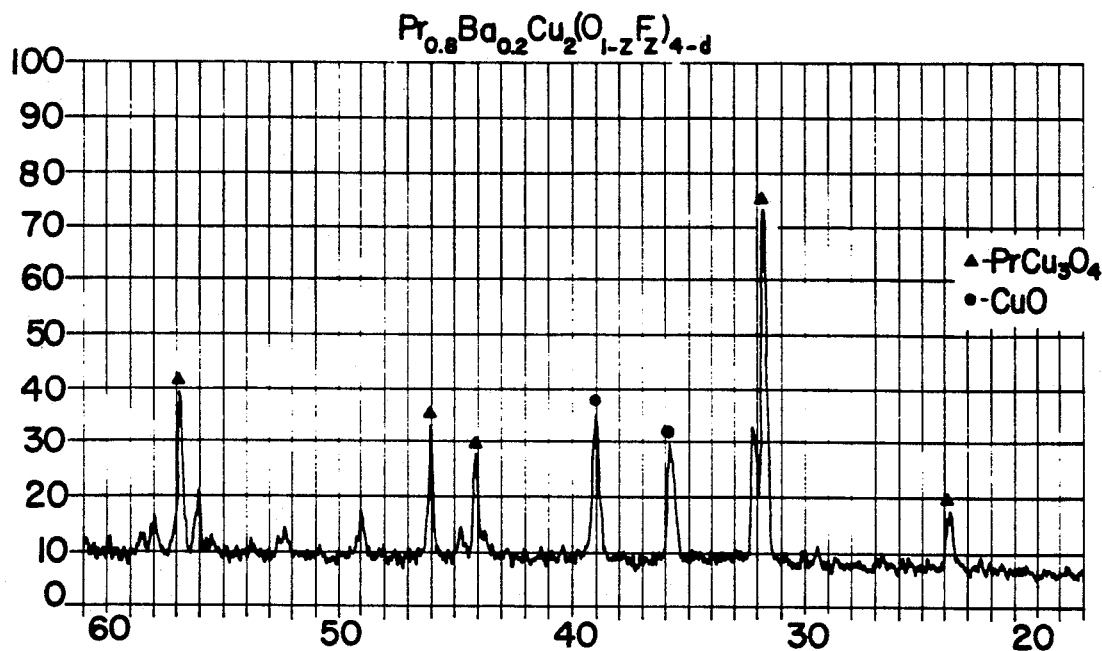
FIG. 17 is an X-ray crystallography graph developed using the doped oxide $Pr_{0.8}Ba_{0.2}Cu_2(O_{1-z}F_z)_{4-d}$.

Other rare earth metals may be used in lieu of Yttrium. For example, the starting oxide $Pr_2O_3$ may be used in a manner otherwise identical to that described above, where the $BaF_2$ or $SrF_2$ should be employed to give an x value of from about 0.2 to 1 in the nominal formula $Pr_{1-x}Ba_xCu_2(O_{1-z}F_z)_{4-d}$. The resistivity data generated from the oxide $Pr_{0.8}Ba_{0.2}Cu_2(O_{1-z}F_z)_{4-d}$ is illustrated in FIG. 10, whereas the X-ray spectrum of this oxide is shown in FIG. 17.

The rare earth Cuprate superconductors in accordance with the invention are made using $BaF_2$ or $SrF_2$ rather than normal oxides for two reasons. First, YCu$_2$O$_{4-y}$ is itself oxygen deficient simply from electrovalency considerations. Thus any further substitution of Y by Ba will further increase the oxygen deficiency to an extent that the structure would become unstable unless placed in a pure oxygen environment. However, replacement of some oxygen with twice the amount of fluorine eliminates the presence of excessive vacant cation sites in the structure. Secondly, the Y$_{1-x}$Ba$_x$Cu$_2$(O$_{1-z}$F$_z$)$_{4-d}$ phase is formed at 1250° C. If BaO or BaCO$_3$ is used with the precursor YCu$_2$O$_{4-y}$ and heated in air, it will melt prematurely. Heating at the 950° C. range will, however, result only in the formation of the well-known superconducting oxide YBa$_2$Cu$_3$O$_{7-d}$, together with some green Y$_2$BaCuO$_x$.

Accordingly, it is believed that the primary reason that fluorine is needed is to prevent excessive cation vacancies. Thus, it is reasonable to expect that rare earth metals such as Pr, which has a +4 as well as +3 valencies will be a better element in the formation of such an oxide. Indeed, it was found that the precursor PrCu$_2$O$_{4-y}$ is black in color and semiconducting in its normal phase.

It is well-known that there is a high degree of anisotropy of super-current flowing through unit cell of a superconductor and it is believed that the CuO$_2$ plane carries the charged carriers. One of the features of the present invention is the fact that the T$_c$ value of a complex superconductor can be related to the geometrical structure, and subunit makeup, of the superconductor. Thus, the invention provides a practical, systematic means of increasing the T$_c$ values of new superconductors. Preferably, however, we can build such a "T$_c$-structure bridge" using a particular theoretical model of superconductivity. In the Excitonic Enhancement Model proposed by Wong and Ching, the total excitation gap of the charged excitonic pair is directly proportional to the intrinsic hole density of the system. Each substructure (like the 112 substructures described above) provides a fixed amount of intrinsic hole density. The total intrinsic hole density is the linear sum of these substructures intrinsic hole density and the final T$_c$ of the sample is therefore obtainable using the following two criteria: (i) T$_c$ is the linear sum of that provided by the substructures; (ii) If the T$_c$ sum rule fails in a particular sample, it may be a multi-phase one and the sudden drops of the R-T curve may be used to guess the various substructures that might compose the sample.

For example, the Cu-112 substructure has a T$_c$ of 80°-90° K., and the known Ill substructure (corresponding to FIG. 1(b)) has a T$_c$ of 35°-45° K. Further, if we assign a corresponding T$_c$ value of 40° K. to the substructure 1(c), we come up with T$_c$ value of the 2223 structure to lie between 110° to 130° K., and that of the 2122 structure to be between 70°-90° K. The 123 structure is nothing more than the extended 112 structure as discussed above. Therefore, we expect its T$_c$ to be also of 80°-90° K.; so far, the known superconductors follow the sum rule. With these identifications, we then predict that the 1234 structure should have a T$_c$ of 120°-130° K. A T$_c$ prediction for the 1324 structure is difficult, because the FIG. 1(c) substructure is difficult to fabricate. Moreover, the 1324 composition can easily form the single-phase 123 substructure unless the complete structure is carefully fabricated in successive steps.

We claim:

1. Stable superconducting ceramic oxides having the formula $$(Ca_{1-x}Q^{**}{}_x)_i A_j Cu_2 O_{5-d}$$

where:
x ranges from about 0.05 to 0.3, Q** is a dopent selected from the group consisting of Bi and Tl, A is selected from the group consisting of Sr and Ba, d is an oxygen deficiency factor ranging up to about 0.5, and i and j are both equal to 1.

2. Superconducting ceramic oxides as set forth in claim 1, wherein x is 0.2, Q is Bi, and A is Sr.

3. Superconducting oxides having the formula $$R_{1-x}Q_x)Cu_2(O_{1-z}F_z)_{4-d}$$

where
R is a rare earth metal, Q is a dopent selected from the group consisting of Ba and Sr, x is from about 0.2 to less than 1, z is greater than zero but less than 1, and d is an oxygen deficiency factor ranging up to about 0.5

4. The oxide of claim 3 having the formula Y$_{0.8}$Ba$_{0.2}$Cu$_2$(O$_{1-z}$F$_z$)$_{4-d}$.

* * * * *